US012683591B2

(12) United States Patent
Park et al.

(10) Patent No.: US 12,683,591 B2
(45) Date of Patent: Jul. 14, 2026

(54) PRESCALER WITH DIFFERENTIAL CLOCK INPUTS FOR HIGH FREQUENCY OPERATION

(71) Applicant: QUALCOMM Incorporated, San Diego, CA (US)

(72) Inventors: Sang Wook Park, San Diego, CA (US); Junheng Zhu, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 210 days.

(21) Appl. No.: 18/633,978

(22) Filed: Apr. 12, 2024

(65) Prior Publication Data

US 2025/0323633 A1     Oct. 16, 2025

(51) Int. Cl.
  *H03K 5/135*      (2006.01)
  *H03K 3/012*      (2006.01)
  *H03K 3/037*      (2006.01)
  *H03K 5/133*      (2014.01)

(52) U.S. Cl.
  CPC ............. *H03K 5/135* (2013.01); *H03K 3/012* (2013.01); *H03K 3/037* (2013.01); *H03K 5/133* (2013.01)

(58) Field of Classification Search
  CPC ........ H03K 21/10; H03K 23/68; H03K 23/66; H03K 23/40; H03K 19/20; H03K 21/08; H03K 21/00; H03K 19/00
  See application file for complete search history.

(56) References Cited

U.S. PATENT DOCUMENTS 4,489,279 A * 12/1984 Kuroki ................... H03K 21/00
                                          327/101
7,012,455 B2 * 3/2006 Chen .................... H03K 23/546
                                          327/117

* cited by examiner

*Primary Examiner* — Diana J. Cheng
(74) *Attorney, Agent, or Firm* — Loza & Loza, LLP

(57)        ABSTRACT

Aspects relate to a divide by 3 prescaler for an integrated circuit. An apparatus includes a first logic block configured to generate a first input pulse at a rising edge of a clock signal, and a second logic block configured to generate a second input pulse after the first input pulse that ends at a falling edge of the clock signal. The falling edge is for a clock cycle subsequent to the rising edge. A third logic block is coupled to the first input pulse and the second input pulse and configured to generate a divide by 3 clock output.

20 Claims, 8 Drawing Sheets

200

204
Charge
Pump

206
Low-
Pass
Filter

208
Voltage-Controlled
Oscllator core

210
VCO
buffer ck

234 up    dn    224

Phase
Frequency
Detector

220

222

XO_in

212
Prescaler

Prescaler
(div3)

236

232

Feedback
divider

218

Line Valid

216

Post
divider

214 lv_main,
lv_aux

202

Start up (Fmin)

Overshoot during locking (Fmax)

500

700

Time

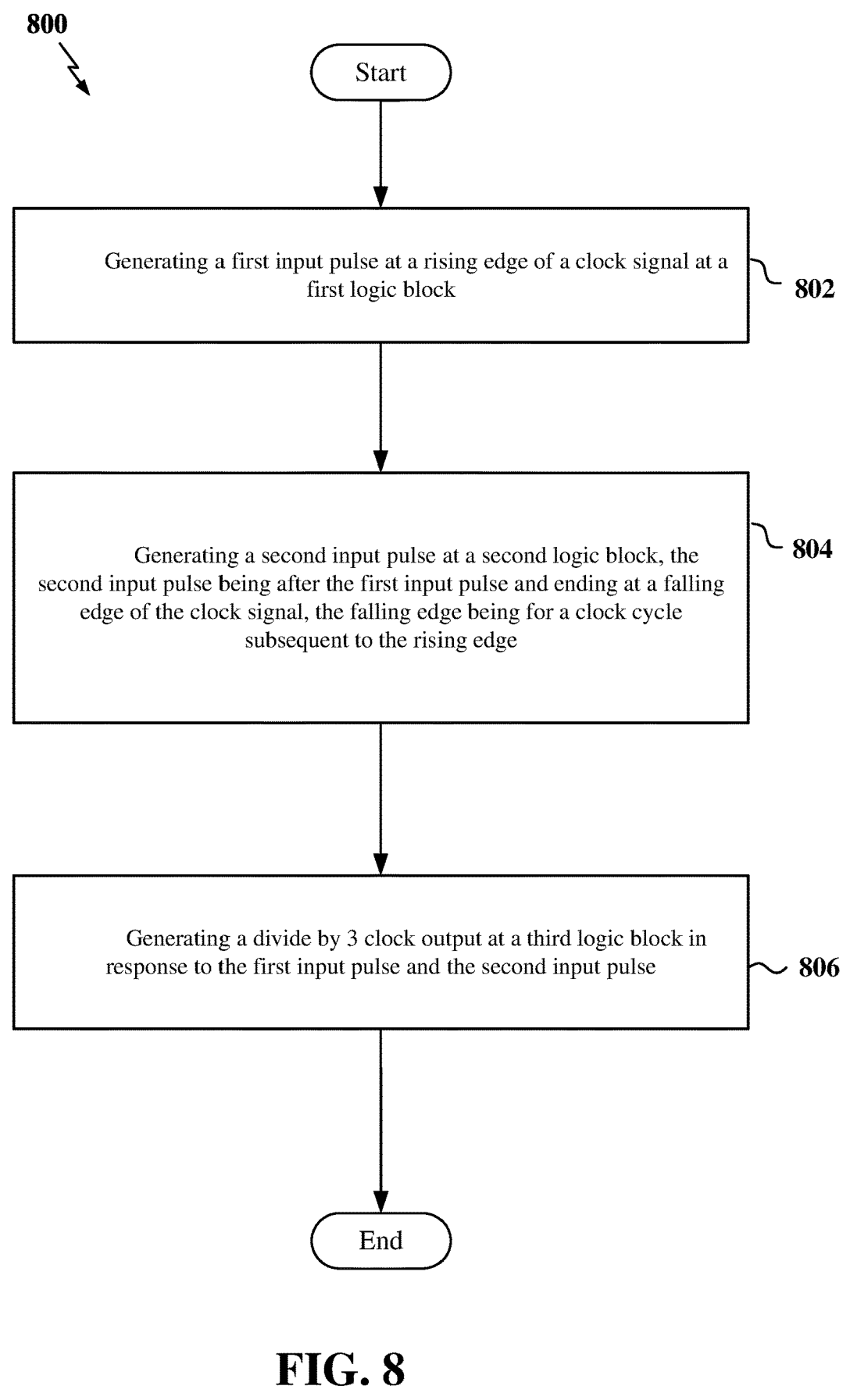

800

Start

Generating a first input pulse at a rising edge of a clock signal at a first logic block    802

Generating a second input pulse at a second logic block, the second input pulse being after the first input pulse and ending at a falling edge of the clock signal, the falling edge being for a clock cycle subsequent to the rising edge    804

Generating a divide by 3 clock output at a third logic block in response to the first input pulse and the second input pulse    806

End

FIG. 8

PRESCALER WITH DIFFERENTIAL CLOCK INPUTS FOR HIGH FREQUENCY OPERATION

TECHNICAL FIELD

Aspects of the present disclosure relate generally to prescalers and frequency dividers and, in particular, to a prescaler with differential clock inputs.

BACKGROUND

A switched capacitor charge pump is used to provide Direct Current (DC) power to an amplifier, e.g., a Class G or Class H amplifier. Charge pumps are small and inexpensive to fabricate in semiconductor circuitry. Switched capacitor charge pumps may be configured for a voltage step-up, a voltage step-down and for multi-level voltage outputs. Switched capacitor charge pumps notably avoid the cost of an external or even an integrated inductor that may be required for a buck converter or a flyback converter.

For many integrated circuit applications, the charge pump is configured to produce one of two different output power levels. When an amplifier frequently operates at partial capacity, e.g., half of its full gain or less, then the power consumption of the charge pump and the amplifier can be reduced by supplying less power from the charge pump to the amplifier. When the amplifier provides higher power, e.g., more than half of its full gain, then the charge pump switches to provide the full power. The charge pump may be controlled by a control signal, that indicates the amplification that the connected amplifier will be providing.

BRIEF SUMMARY

The following presents a summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

In one example, a divide by 3 prescaler includes a first logic block configured to generate a first input pulse at a rising edge of a clock signal, and a second logic block configured to generate a second input pulse after the first input pulse that ends at a falling edge of the clock signal. The falling edge is for a clock cycle subsequent to the rising edge. A third logic block is coupled to the first input pulse and the second input pulse and configured to generate a divide by 3 clock output.

In another example a method includes generating a first input pulse at a rising edge of a clock signal at a first logic block, generating a second input pulse at a second logic block, the second input pulse being after the first input pulse and ending at a falling edge of the clock signal, the falling edge being for a clock cycle subsequent to the rising edge, and generating a divide by 3 clock output at a third logic block in response to the first input pulse and the second input pulse.

In another example, a divide by 3 prescaler for an integrated circuit includes a first logic block configured to generate a first input pulse in response to a clock signal, a second logic block configured to generate a second input pulse delayed after the first input pulse by a half cycle of the clock signal, and a third logic block coupled to the first input pulse and the second input pulse and configured to odd divide the clock signal in response to the first input pulse and the second input pulse to generate a divide by 3 clock output.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

BRIEF DESCRIPTION OF THE DRAWINGS

FIG. 8 is a process flow diagram of operating a divide by 3 prescaler in accordance with aspects of the disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, these concepts may be practiced without these specific details. In some instances, well-known structures and components are shown in block diagram form in order to avoid obscuring such concepts.

Figure 1:
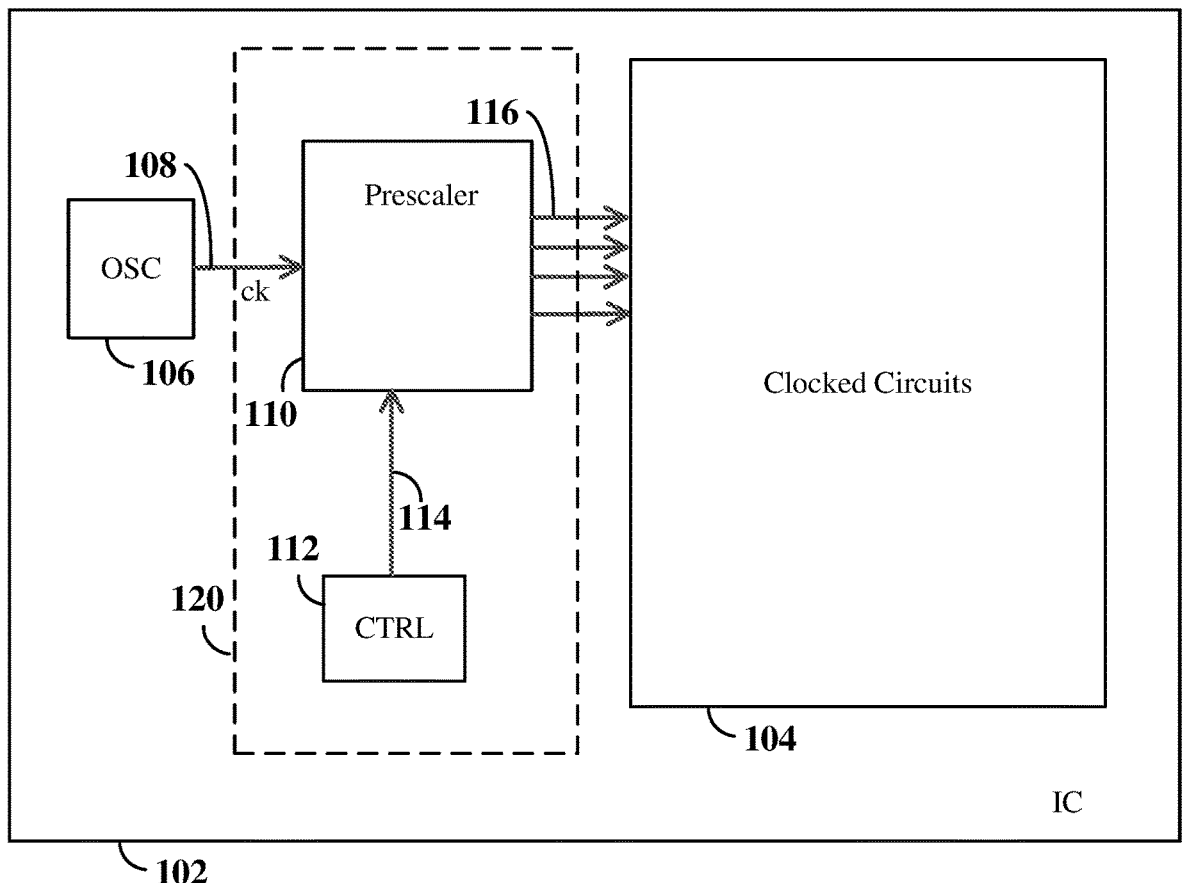
FIG. 1 is a block diagram of an integrated circuit suitable for use with the prescaler circuits described herein.

FIG. 1 is a block diagram of an integrated circuit (IC) 102 suitable for use with the prescaler circuits described herein. The IC 102 has clocked circuits 104. The clocked circuits 104 may be of any suitable type for computation, signal processing, sensing, receiving, and transmitting. A clock system 120 receives a main clock signal 108 from an oscillator 106, e.g., a phase-locked loop (PLL), a voltage-controlled oscillator (VCO), a crystal oscillator, (XO), an external reference clock, etc., which generates the main clock signal (ck) 108 with a clock frequency. The main clock signal 108 is coupled to a prescaler 110 of the clock system 120, e.g., a programmable frequency divider. The prescaler 110 is coupled to a controller 112 of the clock system 120 that sends commands on a command line 114 to the prescaler 110. The prescaler 110 is a programmable frequency divider that can divide the main clock signal by one or more different integers based on commands received on the command line 114 and then provide each divided clock signal as one of a variety of clock output lines 116 to the clocked circuits 104. A circuit for dividing by 3 is described herein, however, the prescaler 110 may also generate other signals for other clock output lines, e.g. a divide by 2, 4, 6, 8, etc. to supply to clocked circuits 104 that operate with different ones of the clock output lines 116.

Figure 2:
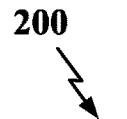
FIG. 2 is a block diagram of an alternative clock system suitable for use in an integrated circuit and with the prescaler circuits described herein.

FIG. 2 is a block diagram of an alternative clock system 200 suitable for use in an integrated circuit and with the prescaler circuits described herein. A prescaler 212, which includes a divide by 3 prescaler 236, receives a main clock line 234 and generates one or more clock output lines 232 which are provided as the clock output line 202, e.g., line valid main and line valid auxiliary, through a post divider 214. The clock output line 202 is provided to clocked circuits (not shown) of a larger system for operation of the clocked circuits. The prescaler 212 includes a divide by 3 prescaler 236 to generate a divide by 3 clock signal for the clock output lines 232 and may have other circuits for other divisions to suit the connected clocked circuits.

The clock system 200 has closed loop feedback to maintain the accuracy of the main clock signal. The clock output lines 232 from the prescaler 212 are also provided to a feedback divider 216 that is operated under a control line 218 from a Line Valid source. The output of the feedback divider 216 is provided to a phase frequency detector 220 that generates up and down outputs 224 to a charge pump 204. The phase frequency detector 220 compares the output of the feedback divider 216 to a reference clock input signal XO_in 222, e.g. a crystal oscillator or a main system clock. The up and down outputs 224 are applied to the charge pump 204 to adjust the output voltage of the charge pump 204. The charge pump 204 output is applied through a low-pass filter 206 to a voltage-controlled oscillator (VCO) core 208. The VCO core 208 generates an oscillating signal in response to the voltage from the charge pump 204. The oscillating signal is provided to a VCO buffer 210 that provides the main clock line 234 for use by the prescaler 212.

Figure 3:
FIG. 3 is a diagram of a divide by 3 (div3) prescaler in accordance with aspects of the disclosure.
Figure 3:
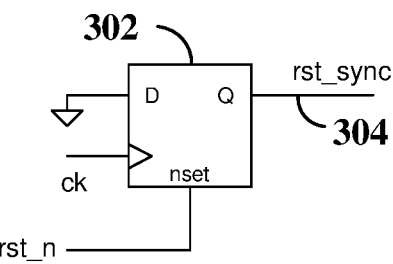
Figure 3:
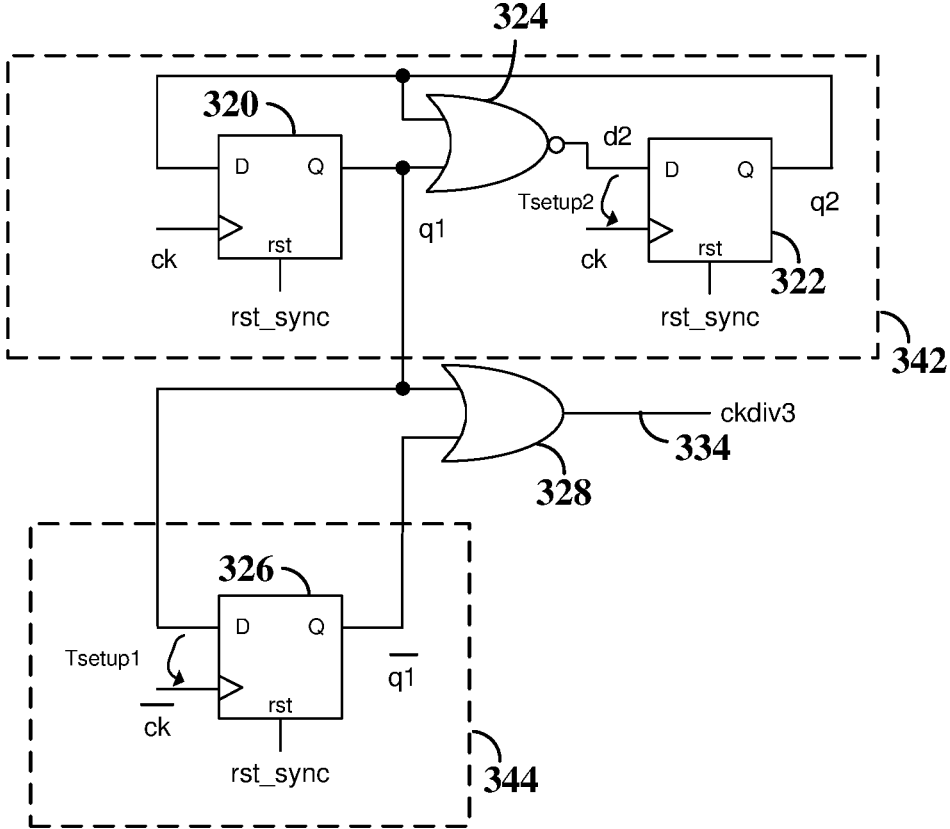

FIG. 3 is a diagram of a divide by 3 (div3) prescaler 300. A sync D-Type flip flop, or delay flip-flop (DFF) 302 of a synchronization block receives the main clock signal (ck) at a clock input and a reset n (rst_n) signal at an nset input. The D input is held low. A Q output generates a reset synchronization signal (rst_sync) 304 in response to the rst_n input and the main clock signal ck.

Figure 4:
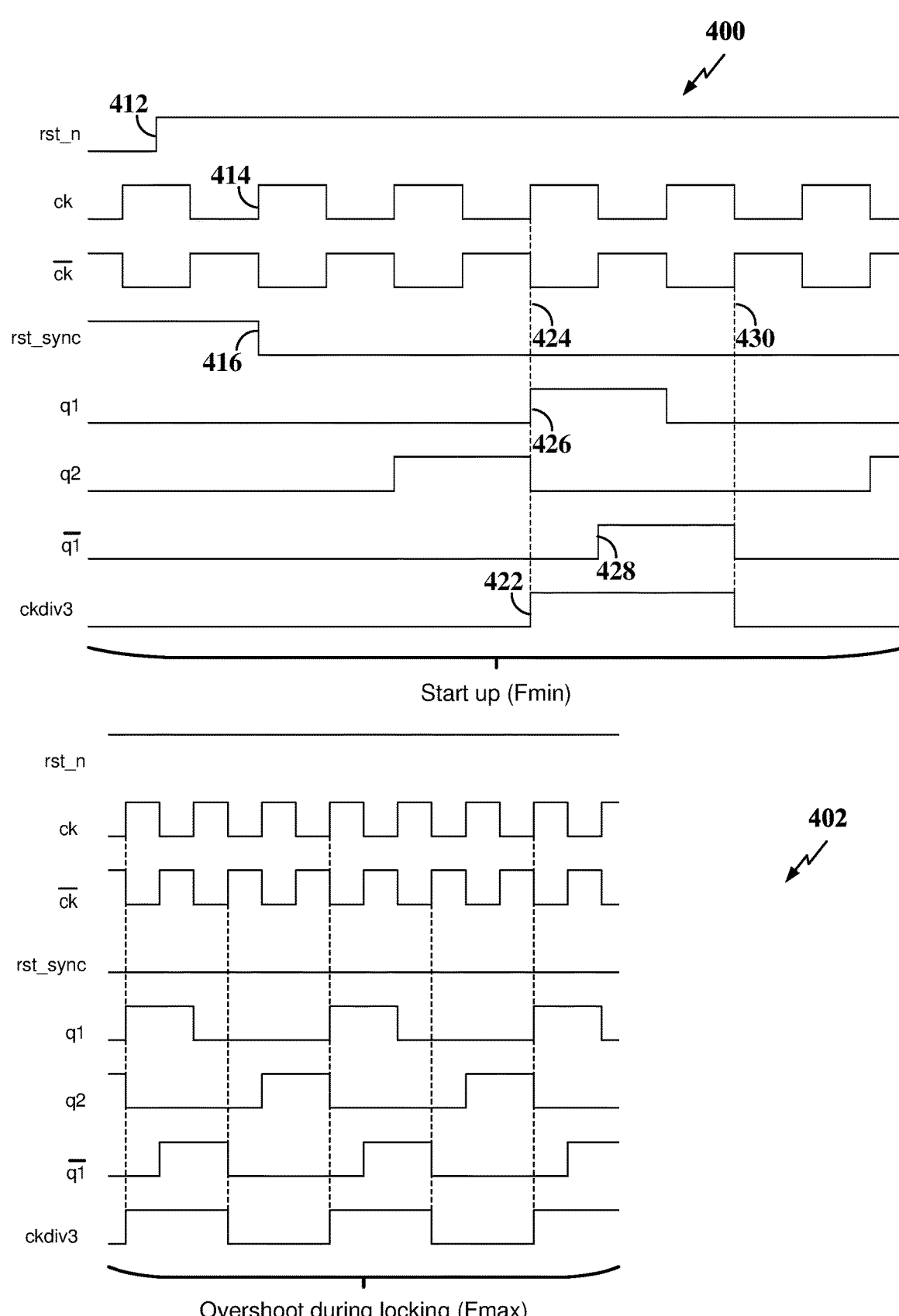
FIG. 4 is a timing diagram of the signals at different locations on the div3 prescaler of FIG. 3 in accordance with aspects of the disclosure.

FIG. 4 is a timing diagram of the signals at different locations on the div3 prescaler 300 of FIG. 3. The upper portion 400 shows the signals at startup and with a main clock signal, ck, at a low frequency, e.g., Fmin. The lower portion 402 shows the signals at the same nodes when the main clock signal's frequency is higher, e.g., Fmax. The signals are shown as amplitude (high or low) on the vertical axis vs. time on the horizontal axis. The signals are rst_n, ck, ckb, rst_sync, q1, q2, q1b, and the ckdiv3 output. These are described in more detail below. The sync DFF 302 generates a reset sync (rst_sync) signal 304 at 416, as shown in FIG. 4, as low after rst_n goes high at 412 at the next rising edge 414 of the main clock signal (ck) at the clock input. The sync DFF 302 holds the rst_sync signal low through the operation of the div3 prescaler in the upper portion 400 and the lower portion 402.

Referring to FIG. 3, the rst_sync signal is applied to a reset input of a first DFF 320 of the divider block and a reset input of a third DFF 326. The first DFF 320 receives the main clock signal (ck) at its clock input. The D input is coupled to a feedback signal and the Q output (q1) is applied as a first input pulse to a first NOR 324, also referred to as NOR. The second input pulse to the first NOR 324 is the feedback signal that is applied to the D input of the first flip-flop 320. An inverted output (d2) of the first NOR 324 output is a D input to a second DFF 322. The second DFF 322 receives ck at the clock input, the rst_sync signal at the reset input and produces an output q2 at its Q output. The second Q output q2 is the feedback signal to the first NOR 324 and to the first DFF 320.

The Q output (q1) of the first DFF 320 is applied as the D input to the third DFF 326 which receives an inverse clock or clock bar (ckb) at its clock input. Based on these inputs it generates an inverse q1, or q1 bar (q1b) at its Q output. q1 and q1b are applied as the first input pulse and the second input pulse to a second OR 328 the output 334 of which is the divide by 3 output of the div3 prescaler (ckdiv3). With the second OR 328 the ckdiv3 output is high at 422 of FIG. 4 at time 424 when q1 goes high at 426 and ckdiv3 stays high after q1b goes high at 428 until q1b goes low at time 430. The same relationships also hold for the lower portion 402 of FIG. 4.

The first DFF 320, the second DFF 322, and the first NOR 324 are components of a first logic block 342 of the prescaler to generate the first input pulse q1 to the first OR gate 328. The third DFF 326 is a component of a second logic block 344 of the prescaler to generate the second input pulse q1b to the first OR gate 328. The OR gate 328 is a component of a third logic block. Each logic block may have more or fewer components.

As shown in FIG. 3, to generate a final output of 50% duty cycle, the odd division of the input clock signal (ck) is q1 from the first DFF 320 and it is ORed at the second OR 328 with a delayed version of itself, q1b, generated by the third DFF 326, by a half cycle. q1b is delayed by a half cycle because it operates on the inverse clock, ckb. The half cycle delay sets a limitation on the setup time, Tsetup1, of the third DFF 326 with respect to a high-speed clock signal. This setup time determines an upper limit on the highest operating frequency, Fmax, of the prescaler.

The maximum operating frequency of the division, i.e., ckdiv3 is further limited by a second setup time Tsetup2 dictated by the second DFF 322 used to generate the delay, ckb. The input to the third DFF 326 is derived from ck using an inverter. As a result, variations in the inverter and parasitic capacitance loading the original ck signal output severely limits the Tsetup2 margin of the second DFF 322, making it increasingly difficult for the div3 prescaler to function at high frequencies.

Figure 5:
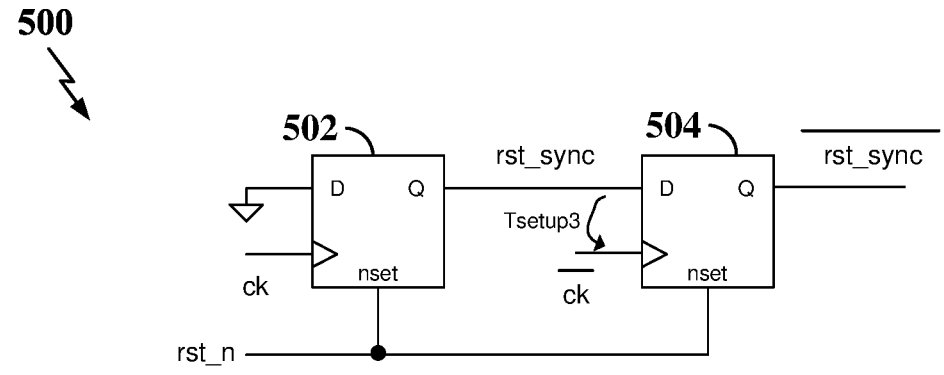
FIG. 5 is a diagram of an alternative divide by 3 (div3) prescaler in accordance with aspects of the disclosure.
Figure 5:
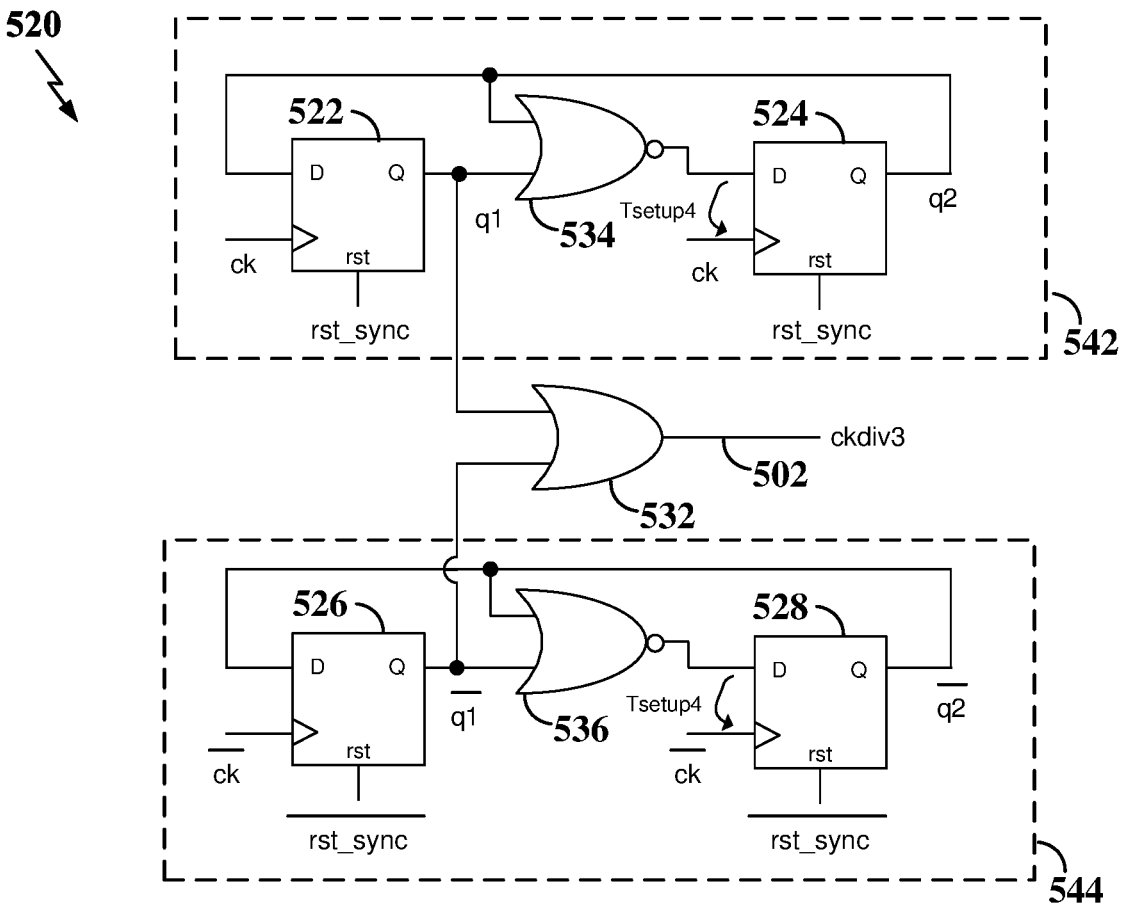

FIG. 5 is a diagram of an alternative divide by 3 (div3) prescaler. A reset synchronization block 500 has a first DFF 502 connected from its Q output to the D input of a second DFF 504. The first DFF 502 has the main clock signal (ck) coupled to its clock input and the reset negative signal (rst_n) coupled to an nset port. The D input is held low. As in the example of FIG. 3, the first DFF 502 generates a reset synchronization signal (rst_sync) at its Q output.

This reset synchronization block 500 of the prescaler also generates an inverse reset synchronization signal or reset bar (rst_syncb) at the second DFF 504. The second DFF 504 receives rst_sync at its D input, an inverse main clock signal (ckb) at its clock input and the rst_n signal at its nset input. The second DFF 504 has a setup time Tsetup3 that does not delay the generation of the rst_syncb signal at low frequencies but may affect operation if the div3 prescaler is started at a high frequency.

Figure 6:
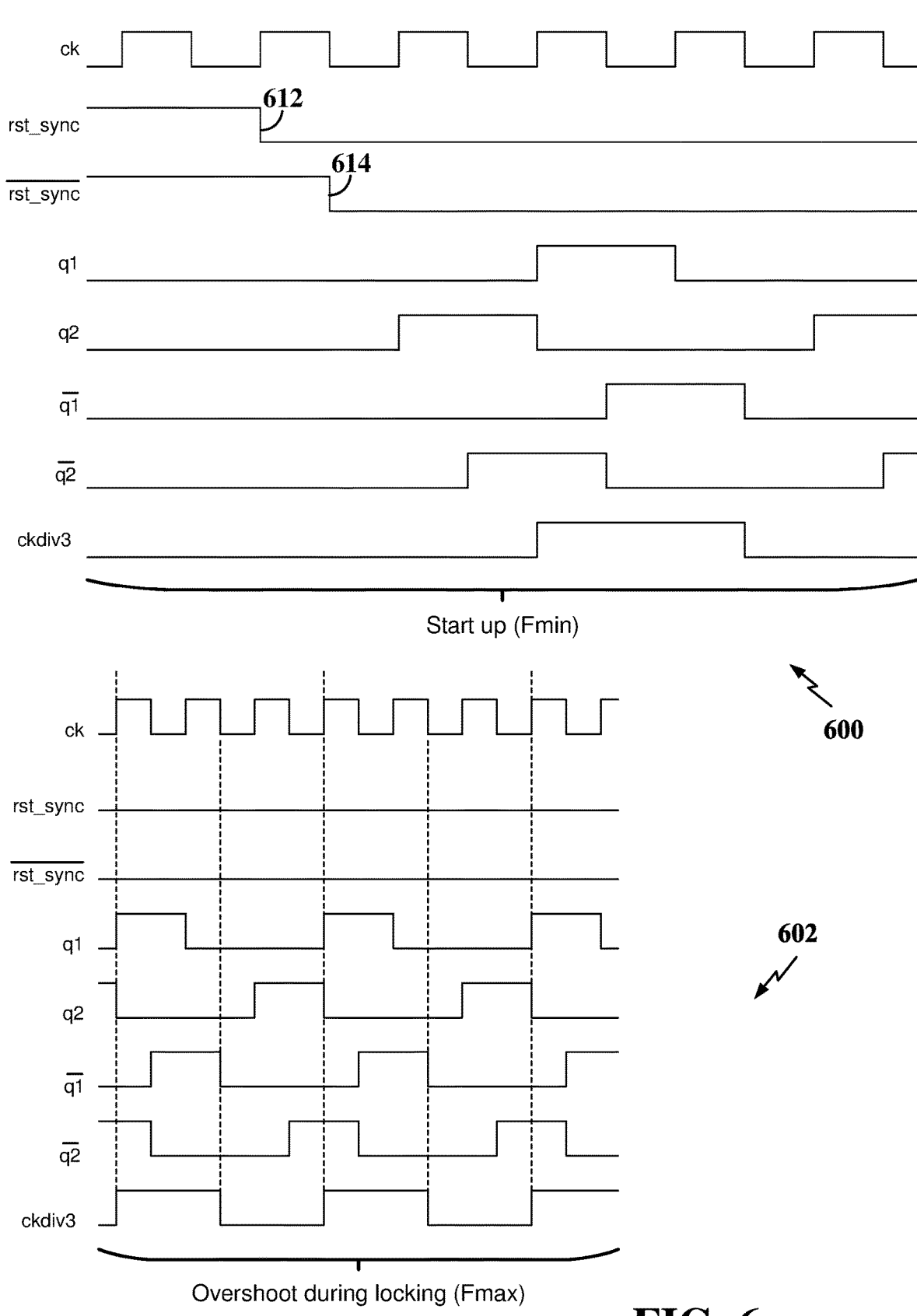
FIG. 6 is a timing diagram of the signals at different locations on the div3 prescaler of FIG. 5 in accordance with aspects of the disclosure.

FIG. 6 is a timing diagram of the signals at different locations on the alternative div3 prescaler of FIG. 5. The upper portion 600 shows the signals at startup and with a main clock signal, ck, at a low frequency, e.g., Fmin. The lower portion 602 shows the signals at the same nodes when the main clock frequency is higher, e.g. Fmax. The signals are shown as amplitude (high or low) on the vertical axis vs. time on the horizontal axis. The signals are ck, rst_sync, rst_syncb, q1, q2, q1b, q2b, and the ckdiv3 output. These are described in more detail below. The waveforms and timing of the signals are identical to those of FIG. 4 but with the addition of rst_syncb and q2b which are not present in the div3 prescaler 300 of FIG. 3, but which are present in the div3 prescaler of FIG. 5. rst_n and ckb are not shown in FIG. 6, but the waveforms and timing of these are the same as in FIG. 4.

With respect to the reset synchronization block 500. On startup, the rst_sync goes low at 612 on a rising edge of ck after rst_n (not shown) goes high. rst_syncb goes low at 614 after rst_sync goes low at the D input of the second DFF 504 and on a rising edge of ckb, which is a falling edge of ck. The rst_sync and rst_syncb signals are held low by the first flip flop 502 and the second flip-flop 504, respectively, through the operation of the circuit and shown in the lower portion 602 of the FIG. 6.

A divider block 520 of the div3 prescaler receives the rst_sync and rst_syncb signals. The divider block 520 generates the divide by 3 clock output (ckdiv3) 502 using a first OR 532 that is connected to a q1 as the first input pulse from a first DFF 522 and a q1b as a second input pulse from a third DFF 526. The first DFF 522 and the third DFF 526 are independently connected in the same way except that the third DFF 526 uses an inverse clock, ckb, at its clock input and the inverse reset synchronization, rst_syncb, signal at is reset input.

The first DFF 522 has the main clock (ck) coupled to its clock input, the rst_sync coupled to its reset input and a feedback line q2 coupled to its D input. The Q output generates a q1 signal that is the first input pulse of the two inputs to the first OR 532. The q1 output is coupled to an input of a second NOR 534. The second input of the second NOR 534 is q1, the feedback line. The second NOR 534 output is inverted and coupled to a D input of a second DFF 524. The second DFF 524 has ck coupled to its clock input, rst_sync coupled to its reset input and produces the feedback line q2 at its Q output. The first DFF 522, the second DFF 524, and the second NOR 534 form a first logic block 542 that is similar to the first logic block 342 of the prescaler of FIG. 3.

The third DFF 526 has the inverse main clock (ckb) coupled to its clock input, the inverse rst_syncb coupled to its reset input and a feedback line q2b coupled to its D input. The Q output generates a q1b signal that is the second input pulse of the two inputs to the first OR 532. The q1b output is also coupled to an input of a third NOR 536. The second input of the third NOR 536 is q2b, the feedback line which is coupled to the D input of the third DFF 526. The third NOR 536 output is inverted and coupled to a D input of a fourth DFF 528. The fourth DFF 528 has ckb coupled to its clock input, rst_syncb coupled to its reset input and produces the feedback line q2b at its Q output. The third DFF 526, the fourth DFF 528, and the third NOR 536 are components of a second logic block 544. This is similar to the first logic block 542 of the prescaler with the first DFF 522, the second DFF 524 and second NOR 534. The connections and structure of the first logic block 542 and the second logic block 544 are the same except that the first DFF 522 and the second DFF 524 are connected to ck at the clock input and rst_sync at the rest input, while the third DFF 526 and the fourth DFF 528 are coupled to the inverse signals, ckb at the clock input and rst_syncb at the reset input. The first OR 532 is a component of a third logic block. Each logic block may have more or fewer components.

As shown, the first logic block 542 generates a first input pulse q1 at a rising edge of ck. The second logic block 544 generates a second input pulse q1b after the first input pulse and that ends at a falling edge of ck. The falling edge is for a clock cycle subsequent to the rising edge. The third logic block receives the q1 and q1b to generate the divide by 3 clock output, ckdiv3.

The maximum frequency of the operation of the div3 prescaler 500 is not limited by the setup time for a DFF used to generate a delay. Instead, two separate div3's are derived from the oscillator differential outputs ck and ckb respectively. This has multiple benefits.

First, the parasitic loading is better balanced out. The overall parasitic elements from the two div3 paths the upper path through the first DFF 522 and the second DFF 524 and the lower path through the third DFF 526 and the fourth DFF 528, are configured to match and therefore the overall parasitic elements offset each other for any timing variations observed at the final OR, i.e. the first OR 532, gate input nodes. The parasitic elements are configured to approximately match by using the same circuit design and the same circuit elements for the first logic block and the second logic block. In addition, by operating the second logic block 544 with a delay of one half cycle of the clock signal with respect to the first logic block, the parasitic elements will cancel. The second logic block is delayed by one half cycle by using the inverse clock signal as the clock input.

Second, the maximum operating frequency is not affected by the setup time of the second DFF 524 or the fourth DFF 528 setup time, Tsetup4, but only by the setup time of the reset synchronization block Tsetup3. FIG. 6 shows that the 50% duty cycle div3 output is generated by combining q1 and q1b as in the example of FIG. 4. The div3 prescaler operates well when the two paths, generating q1 and q1b, operate sequentially. This can be caused by the half-cycle delay between rst_sync and rst_syncb. The timing relationship between rst_sync and rst_syncb is determined by the setup time, Tsetup3, of the second DFF 504 in the reset synchronization block 500. The second DFF 504 has a setup time, Tsetup3, that operates when ck is at Fmin unlike Tsetup1 of DFF 322 and Tsetup2 of DFF 326 which operate when ck is at a frequency between Fmin and Fmax in the div3 prescaler of FIG. 3.

Figure 7:
FIG. 7 is a timing diagram of the ckdiv3 output of the two div3 prescalers of FIGS. 3 and 5 in accordance with aspects of the disclosure.
Figure 7:
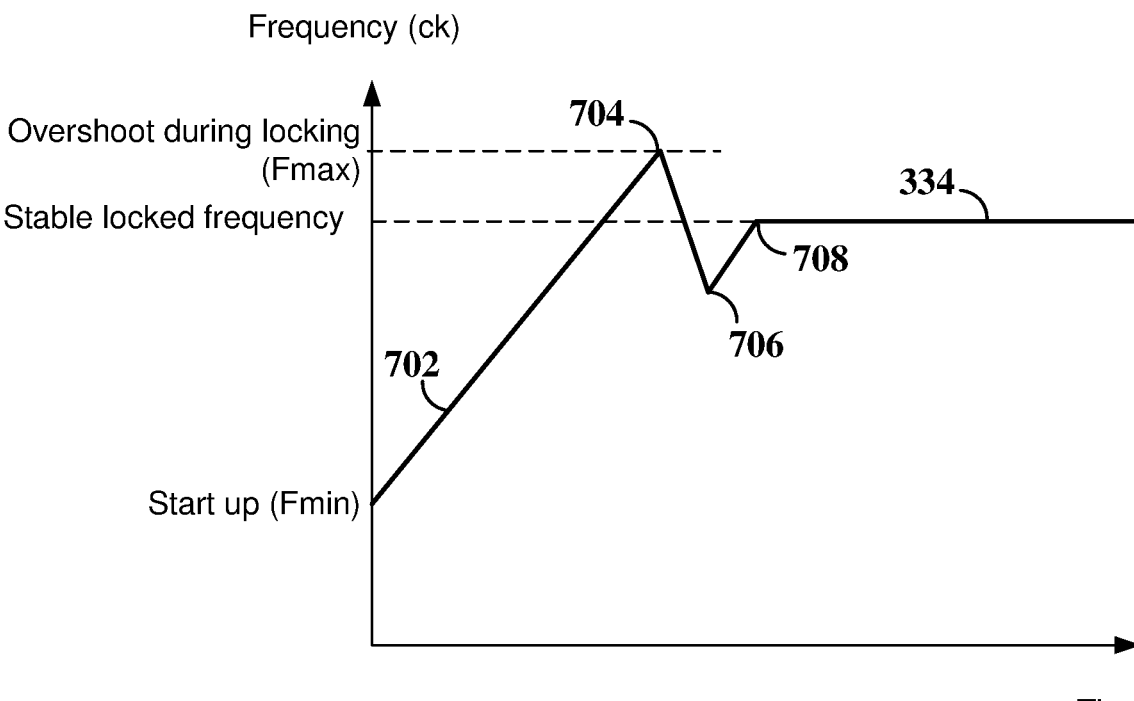

FIG. 7 is a timing diagram of frequency over time of the ckdiv3 output. The timing diagram 700 shows the ckdiv3 output 334 of the div3 prescaler 300 of FIG. 3. At time 0 or start up, the ckdiv3 output increases along a slope 702 that is approximately a linear ramp from the minimum frequency, Fmin, of the main clock signal, ck, to the maximum frequency of ck, Fmax at 704. The setup times, Tsetup 1 and Tsetup 2, have the minimum margin at 704. After the overshoot at 704, the frequency then settles with a fall at 706 and recovery at 708 to reach the stable locked frequency at 334.

FIG. 8 is a process flow diagram of operating a divide by 3 prescaler as described herein. The process 800 starts and then at 802, a first input pulse is generated at a rising edge of a clock signal at a first logic block. In an example, the first input pulse is generated as going high at the rising edge and then low on a rising edge of a next clock cycle. In an example, the first logic block generating the first input pulse by a first flip-flop in response to the clock signal and generates a feedback signal at a second flip-flop to a D input of the first flip-flop in response to the clock signal. An example includes receiving the first input pulse and the feedback signal and applying a high to a D input of the second flip-flop of the first logic block in response thereto.

At 804, a second input pulse is generated at a second logic block. The second input pulse is after the first input pulse and ends at a falling edge of the clock signal. The falling edge is for a clock cycle subsequent to the rising edge. In an example, the second input pulse is generated as going high at the falling edge and then low on a falling edge of a next clock cycle.

At 806, a divide by 3 clock output is generated at a third logic block in response to the first input pulse and the second input pulse. In an example the divide by 3 clock output is generated in response to either or both of the first input pulse and the second input pulse. In an example, the divide by 3 output clock is generated as a high when either or both of the first input pulse and the second input pulse are high.

As used herein, "or" is intended to be interpreted in the inclusive sense, unless otherwise explicitly indicated. For example, "a or b" may include a only, b only, or a combination of a and b. As used herein, a phrase referring to "at least one of" or "one or more of" a list of items refers to any combination of those items, including single members. For example, "at least one of: a, b, or c" is intended to cover the examples of: a only, b only, c only, a combination of a and b, a combination of a and c, a combination of b and c, and a combination of a and b and c.

The various illustrative components, logic, logical blocks, modules, circuits, operations, and algorithm processes described in connection with the implementations disclosed herein may be implemented as electronic hardware, firmware, software, or combinations of hardware, firmware, or software, including the structures disclosed in this specification and the structural equivalents thereof. The interchangeability of hardware, firmware and software has been described generally, in terms of functionality, and illustrated in the various illustrative components, blocks, modules, circuits and processes described above. Whether such functionality is implemented in hardware, firmware or software depends upon the particular application and design constraints imposed on the overall system.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor may be a microprocessor and the processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration.

Unless indicated otherwise, any disclosure of an operation of an apparatus having a particular feature is also expressly intended to disclose a method having an analogous feature (and vice versa), and any disclosure of an operation of an apparatus according to a particular configuration is also expressly intended to disclose a method according to an analogous configuration (and vice versa). The term "configuration" may be used in reference to a method, apparatus, or system as indicated by its particular context. The terms "method," "process," "procedure," and "technique" are used generically and interchangeably unless otherwise indicated by the particular context. The terms "apparatus" and "device" are also used generically and interchangeably unless otherwise indicated by the particular context. The terms "element" and "module" are typically used to indicate a portion of a greater configuration. Unless expressly limited by its context, the term "signal" or "pulse" is used herein to indicate any of its ordinary meanings, including a state of a memory location (or set of memory locations) as expressed on a wire, bus, or other transmission medium. Unless expressly limited by its context, the term "generating" is used herein to indicate any of its ordinary meanings, such as computing or otherwise producing. The phrase "based on" does not mean "based only on," unless expressly specified otherwise. In other words, the phrase "based on" describes both "based only on" and "based at least on."

Any incorporation by reference of a portion of a document shall also be understood to incorporate definitions of terms or variables that are referenced within the portion, where such definitions appear elsewhere in the document, as well as any figures referenced in the incorporated portion.

Various modifications to the implementations described in this disclosure may be readily apparent to persons having ordinary skill in the art, and the generic principles defined herein may be applied to other implementations without departing from the spirit or scope of this disclosure. Thus, the claims are not intended to be limited to the implementations shown herein but are to be accorded the widest scope consistent with this disclosure, the principles and the novel features disclosed herein.

Additionally, various features that are described in this specification in the context of separate implementations also can be implemented in combination in a single implementation. Conversely, various features that are described in the context of a single implementation also can be implemented in multiple implementations separately or in any suitable subcombination. As such, although features may be described above as acting in particular combinations, and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one or more example processes in the form of a flowchart or flow diagram. However, other operations that are not depicted can be incorporated in the example processes that are schematically illustrated. For example, one or more additional operations can be performed before, after, simultaneously, or between any of the illustrated operations. In some circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

The following provides an overview of examples of the present disclosure.

Example 1: A divide by 3 prescaler for an integrated circuit, the divide by 3 prescaler comprising: a first logic block configured to generate a first input pulse at a rising edge of a clock signal; a second logic block configured to generate a second input pulse after the first input pulse that ends at a falling edge of the clock signal, the falling edge being for a clock cycle subsequent to the rising edge; and a third logic block coupled to the first input pulse and the second input pulse and configured to generate a divide by 3 clock output.

Example 2: The divide by 3 prescaler of example 1, wherein the third logic block comprises an OR gate that is configured to generate the divide by 3 clock output in response to either or both of the first input pulse and the second input pulse.

Example 3: The divide by 3 prescaler of example 1 or 2, wherein the first logic block is configured to generate the first input pulse as going high at the rising edge and then low on a rising edge of a next clock cycle.

Example 4: The divide by 3 prescaler of example 3, wherein the second logic block is configured to generate the second input pulse as going high at the falling edge and then low on a falling edge of a next clock cycle.

Example 5: The divide by 3 prescaler of example 4, wherein the third logic block comprises an OR gate that is configured to generate a high when either or both of the first input pulse and the second input pulse are high.

Example 6: The divide by 3 prescaler of any one or more of examples 1-5, wherein the first logic block comprises a first flip-flop configured to generate the first input pulse in response to the clock signal and a second flip-flop configured to generate a feedback signal to a D input of the first flip-flop in response to the clock signal.

Example 7: The divide by 3 prescaler of example 6, wherein the first input pulse of the first flip-flop is coupled to a D input of the second-flip-flop through a NOR gate, the NOR gate configured to receive the first input pulse and the feedback signal and to generate a high to a D input of the second flip-flop in response thereto.

Example 8: The divide by 3 prescaler of example 6 or 7, wherein the second logic block comprises a third flip-flop configured to generate the second input pulse in response to an inverse clock signal and a fourth flip-flop configured to generate a feedback signal to a D input of the third flip-flop in response to the inverse clock signal.

Example 9: The divide by 3 prescaler of example 8 further comprising a reset synchronization block configured to generate a reset synchronization signal to provide to the first and second flip-flops in response to a rising edge of a starting clock signal and an inverse reset synchronization signal to provide to the third and fourth flip-flops in response to a falling edge of the starting clock signal.

Example 10: The divide by 3 prescaler of example 1, wherein the second input pulse is delayed by a half cycle of the clock signal with respect to the first input pulse.

Example 11. A method of operating a divide by 3 prescaler, the method comprising: generating a first input pulse at a rising edge of a clock signal at a first logic block; generating a second input pulse at a second logic block, the second input pulse being after the first input pulse and ending at a falling edge of the clock signal, the falling edge being for a clock cycle subsequent to the rising edge; and generating a divide by 3 clock output at a third logic block in response to the first input pulse and the second input pulse.

Example 12: The method of example 11, wherein generating the divide by 3 clock output comprises generating the divide by 3 clock output in response to either or both of the first input pulse and the second input pulse.

Example 13: The method of example 11 or 12, wherein generating the first input pulse comprises generating the first input pulse going high at the rising edge and then low on a rising edge of a next clock cycle.

Example 14: The method of example 13, wherein generating the second input pulse comprises generating the second input pulse as going high at the falling edge and then low on a falling edge of a next clock cycle.

Example 15: The method of example 14, wherein generating a divide by 3 output clock comprises generating a high when either or both of the first input pulse and the second input pulse are high.

Example 16: The method any one or more of examples 11-15, wherein generating the first input pulse comprises the first logic block generating the first input pulse by a first flip-flop in response to the clock signal and generating a feedback signal at a second flip-flop to a D input of the first flip-flop in response to the clock signal.

Example 17: The method of example 16, further comprising receiving the first input pulse and the feedback signal and applying a high to a D input of the second flip-flop of the first logic block in response thereto.

Example 18. A divide by 3 prescaler for an integrated circuit, the divide by 3 prescaler comprising: a first logic block configured to generate a first input pulse in response to a clock signal; a second logic block configured to generate a second input pulse delayed after the first input pulse by a half cycle of the clock signal; and a third logic block coupled to the first input pulse and the second input pulse and configured to odd divide the clock signal in response to the first input pulse and the second input pulse to generate a divide by 3 clock output.

Example 19: The divide by 3 prescaler of example 18, wherein the second logic block uses an inverse clock signal that is generated from the clock signal.

Example 20: The divide by 3 prescaler of example 19, wherein the second logic block operates with a delay of the half cycle of the clock signal with respect to the first logic block.

Example 21: The divide by 3 prescaler of any one or more of examples 18-20 wherein the first logic block and the second logic block are configured to have matching parasitic elements.

What is claimed is:

1. A divide by 3 prescaler for an integrated circuit, the divide by 3 prescaler comprising:
   a first logic block configured to generate a first input pulse at a rising edge of a clock signal;
   a second logic block configured to generate a second input pulse at a first falling edge of the clock signal after the first input pulse and that ends at a second falling edge of the clock signal, the first falling edge being for a clock cycle subsequent to the rising edge; and
   a third logic block coupled to the first input pulse and the second input pulse and configured to generate a divide by 3 clock output.

2. The divide by 3 prescaler of claim 1, wherein the third logic block comprises an OR gate that is configured to generate the divide by 3 clock output in response to either or both of the first input pulse and the second input pulse.

3. The divide by 3 prescaler of claim 1, wherein the first logic block is configured to generate the first input pulse as going high at the rising edge and then low on a rising edge of a next clock cycle.

4. The divide by 3 prescaler of claim 3, wherein the second logic block is configured to generate the second input pulse as going high at the first falling edge and then low on the second falling edge, the second falling edge being of a next clock cycle.

5. The divide by 3 prescaler of claim 4, wherein the third logic block comprises an OR gate that is configured to generate a high when either or both of the first input pulse and the second input pulse are high.

6. The divide by 3 prescaler of claim 1, wherein the first logic block comprises a first flip-flop configured to generate the first input pulse in response to the clock signal and a second flip-flop configured to generate a feedback signal to a D input of the first flip-flop in response to the clock signal.

7. The divide by 3 prescaler of claim 6, wherein the first input pulse of the first flip-flop is coupled to a D input of the second-flip-flop through a NOR gate, the NOR gate configured to receive the first input pulse and the feedback signal and to generate a high to a D input of the second flip-flop in response thereto.

8. The divide by 3 prescaler of claim 6, wherein the second logic block comprises a third flip-flop configured to generate the second input pulse in response to an inverse clock signal and a fourth flip-flop configured to generate a feedback signal to a D input of the third flip-flop in response to the inverse clock signal.

9. The divide by 3 prescaler of claim 8 further comprising a reset synchronization block configured to generate a reset synchronization signal to provide to the first and second flip-flops in response to a rising edge of a starting clock signal and an inverse reset synchronization signal to provide to the third and fourth flip-flops in response to a falling edge of the starting clock signal.

10. The divide by 3 prescaler of claim 1, wherein the second input pulse is delayed by a half cycle of the clock signal with respect to the first input pulse.

11. A method of operating a divide by 3 prescaler, the method comprising:

generating a first input pulse at a rising edge of a clock signal at a first logic block;

generating a second input pulse at a second logic block, the second input pulse being after the first input pulse at a first falling edge of the clock signal and ending at a second falling edge of the clock signal, the first falling edge being for a clock cycle subsequent to the rising edge; and generating a divide by 3 clock output at a third logic block in response to the first input pulse and the second input pulse.

12. The method of claim 11, wherein generating the divide by 3 clock output comprises generating the divide by 3 clock output in response to either or both of the first input pulse and the second input pulse.

13. The method of claim 11, wherein generating the first input pulse comprises generating the first input pulse going high at the rising edge and then low on a rising edge of a next clock cycle.

14. The method of claim 13, wherein generating the second input pulse comprises generating the second input pulse as going high at the first falling edge and then low on the second falling edge, the second falling edge being of a next clock cycle.

15. The method of claim 14, wherein generating a divide by 3 output clock comprises generating a high when either or both of the first input pulse and the second input pulse are high.

16. The method claim 11, wherein generating the first input pulse comprises the first logic block generating the first input pulse by a first flip-flop in response to the clock signal and generating a feedback signal at a second flip-flop to a D input of the first flip-flop in response to the clock signal.

17. The method of claim 16, further comprising receiving the first input pulse and the feedback signal and applying a high to a D input of the second flip-flop of the first logic block in response thereto.

18. A divide by 3 prescaler for an integrated circuit, the divide by 3 prescaler comprising:

a first logic block configured to generate a first input pulse in response to a clock signal;

a second logic block configured to generate a second input pulse at a first falling edge delayed after the first input pulse by a half cycle of the clock signal; and a third logic block coupled to the first input pulse and the second input pulse and configured to odd divide the clock signal in response to the first input pulse and the second input pulse to generate a divide by 3 clock output.

19. The divide by 3 prescaler of claim 18, wherein the second logic block uses an inverse clock signal that is generated from the clock signal.

20. The divide by 3 prescaler of claim 19, wherein the second logic block operates with a delay of the half cycle of the clock signal with respect to the first logic block.

* * * * *